(12) United States Patent
Chen et al.

(10) Patent No.: US 10,672,896 B2
(45) Date of Patent: Jun. 2, 2020

(54) GAN-BASED BIDIRECTIONAL SWITCH DEVICE

(71) Applicant: University of Electronic Science and Technology of China, Chengdu (CN)

(72) Inventors: Wanjun Chen, Chengdu (CN); Yijun Shi, Chengdu (CN); Jie Liu, Chengdu (CN); Xingtao Cui, Chengdu (CN); Guanhao Hu, Chengdu (CN); Chao Liu, Chengdu (CN); Qi Zhou, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/695,078

(22) Filed: Sep. 5, 2017

(65) Prior Publication Data

US 2018/0158936 A1    Jun. 7, 2018

(30) Foreign Application Priority Data

Dec. 2, 2016    (CN) .......................... 2016 1 1095490

(51) Int. Cl.
*H01L 29/205*    (2006.01)
*H01L 29/20*    (2006.01)
(Continued)

(52) U.S. Cl.
CPC ...... *H01L 29/7393* (2013.01); *H01L 29/2003* (2013.01); *H01L 29/205* (2013.01);
(Continued)

(58) Field of Classification Search
CPC ............. H01L 29/7393; H01L 29/2003; H01L 29/205; H01L 29/41766; H01L 29/66462;
(Continued)

(56) References Cited

U.S. PATENT DOCUMENTS

2009/0065810 A1* 3/2009 Honea ................. H01L 27/0605
257/192
2009/0267078 A1* 10/2009 Mishra ................ H01L 29/2003
257/76

(Continued)

FOREIGN PATENT DOCUMENTS

CN    102945859 A    *    2/2013
CN    102945859 A    *    2/2013

*Primary Examiner* — Steven H Loke
*Assistant Examiner* — Juanita B Rhodes
(74) *Attorney, Agent, or Firm* — Bayramoglu Law Offices LLC

(57) ABSTRACT

The present invention relates to the field of semiconductor switches, and relates more particularly to a GaN-based bidirectional switch device. The present invention provides a gate-controlled tunneling bidirectional switch device without Ohmic-contact, which avoids a series of negative effects (such as current collapse, incompatibility with traditional CMOS process) caused by the high temperature ohm annealing process. Each insulated gate structure near schottky-contact controls the band structure of the schottky-contact to change the working state of the device, realizing the bidirectional switch's ability of bidirectional conducting and blocking. Due to the only presence of schottky in this invention, no heavy elements such as gold is needed, and this device is compatible with traditional CMOS technology.

3 Claims, 4 Drawing Sheets

(51) Int. Cl.
  *H01L 29/778* (2006.01)
  *H01L 29/66* (2006.01)
  *H01L 29/423* (2006.01)
  *H01L 29/417* (2006.01)
  *H01L 29/51* (2006.01)
  *H01L 29/739* (2006.01)

(52) U.S. Cl.
  CPC .... *H01L 29/41766* (2013.01); *H01L 29/4236* (2013.01); *H01L 29/66462* (2013.01); *H01L 29/7786* (2013.01); *H01L 29/517* (2013.01)

(58) Field of Classification Search
  CPC ............. H01L 29/4236; H01L 29/7786; H01L 29/517; H01L 29/7831; H01L 29/78; H01L 29/772; H01L 29/47; H01L 29/41725
  See application file for complete search history.

(56) References Cited

U.S. PATENT DOCUMENTS

| | | | | |
|---|---|---|---|---|
| 2012/0220089 A1* | 8/2012 | Imada | ................ | H01L 29/0619 438/270 |
| 2013/0092958 A1* | 4/2013 | Chen | ................... | H01L 29/2003 257/77 |
| 2014/0239346 A1* | 8/2014 | Green | ................ | H01L 27/0629 257/192 |
| 2016/0020313 A1* | 1/2016 | Wu | .................... | H01L 29/7786 257/194 |

* cited by examiner

GAN-BASED BIDIRECTIONAL SWITCH DEVICE

CROSS REFERENCE

The present application is based on, and claims priority from, Chinese application number 201611095490.3, filed on Dec. 2, 2016, the disclosure of which is hereby incorporated by reference herein in its entirety.

TECHNICAL FIELD

The present invention relates to the technical field of semiconductor switches, more particularly, to a GaN-Based bidirectional switch device.

BACKGROUND

Bidirectional switches, capable of conducting currents and blocking voltages of both polarities, are wildly used in many applications, such as compact motor drives, aircrafts, AC power supply units, electric propulsion of ships, and electric cars. Conventional high-voltage bidirectional switches are constructed by two Si-based insulated gate bipolar translators (IGBTs) connected in reversed series and two power diodes, as shown in FIG. 1(a). In this configuration, the current flows through two different devices, this will lead to a high on-state voltage drop, making the bidirectional switches lose more power. To reduce the on-state voltage drop of bidirectional switches and improve efficiency, controllable switches with high reverse blocking (RB) capability, such as RB-IGBTs, have been developed in recent years. The controllable switches with high reverse blocking (RB) capability are as shown in FIG. 1 (b). In this new configuration, the current only flows through a single device, and shorter current path will be beneficial for reducing the on-state voltage drop and lowering on-state loss. But the new configuration goes against chip-area utilization, because only one of the two current channels can conduct currents in the bidirectional conducting mode. In order to cut the cost of bidirectional switches or improve the chip-area utilization, a monolithic bidirectional switch with only one channel and two gates is proposed, as shown in FIG. 1(c). The monolithic bidirectional switch has only one conductive channel, two currents of different direction flow through one channel, so the chip-area utilization is improved. The on-state voltage drop is reduced when current flows through only one channel.

Gallium nitride is one of the representatives of the third generation of wide bandgap semiconductors, which is attracting widespread attention. The superior performance of Gallium nitride mainly lies in high critical breakdown electric field (~$3.5 \times 10^6$ V/cm), high electron mobility (~2000 cm$^2$/V·s), high concentration of two-dimensional electron gas (2 DEG) (~$10^{13}$ cm$^{-2}$), and high temperature working ability. Forbidden band width of GaN materials is up to 3.4 eV, which is 3 times the forbidden band width of Si materials and 2.5 times the forbidden band width of GaAs materials. Intrinsic carrier concentration of the semiconductor materials increases exponentially with the forbidden band width and temperature. Therefore, up to a certain temperature range, more the semiconductor materials forbidden band width, smaller is the intrinsic carrier concentration. This can make the device to have a very low leakage current. In addition, gallium nitride (GaN) is stable in chemical properties, has high temperature resistance, and corrosion resistance and has inherent advantages in high frequency, high power, and anti-radiation application. The high electron migration rate transistor (HEMT) based on AlGaN/GaN heterojunction (or heterojunction effect transistor HFET, modulation doped field effect transistor MODFET) has been widely used in the semiconductor field. This kind of device has the characteristics of high reverse blocking voltage, low positive on-state resistance, and high working frequency, so it can make the semiconductor devices satisfy the requirements of more powerful, smaller volume and higher frequency.

In recent years, in order to achieve low power efficient bidirectional switch, the researchers proposed GaN HEMT devices with reverse conducting type (RC-MISHEMT), but from the above analysis, the bidirectional switch based on reverse conducting type has large on-state voltage drop and on-state loss. In order to further reduce the bidirectional on-state voltage drop and on-state loss and improve the switching efficiency of the switch, the bidirectional switch device is very necessary. Therefore, the invention proposes the GaN-based bidirectional switch device, the structure of which is shown in FIG. 2. Each insulated gate structure near Schottky-contact controls the band structure of the Schottky-contact to change the working state of the device, realizing the bidirectional switch's ability of bidirectional conducting and blocking. Due to the only presence of Schottky in this invention, no heavy element such as gold is necessary, so the present invention is compatible with traditional CMOS technology.

SUMMARY OF INVENTION

In view of the main indexes of high-efficiency power switching devices (chip area utilization, on-state resistance, reverse resistance, and power consumption), the GaN-based bidirectional switch device is proposed. The present invention has the advantages of high utilization of chip area, low on-state resistance, high reverse blocking ability, and low power consumption, especially in matrix converters.

The technical solution of the present invention is as below.

A GaN-based bidirectional switch device comprises a substrate 1, a GaN buffer layer 2, an AlGaN layer 3. The GaN buffer layer 2 and the AlGaN layer 3 form a heterojunction. A Schottky source electrode structure is located at one end of the GaN-based bidirectional switch device, and a Schottky drain electrode structure is located at an other end of the GaN-based bidirectional switch device. The Schottky source electrode structure and the Schottky drain electrode structure are symmetrical with respect to a median vertical line of the GaN-based bidirectional switch device. The Schottky source electrode structure has a grooved Schottky structure, which comprises a recessed trench formed by etching the AlGaN layer 3 and a part of the GaN buffer layer 2 and a source Schottky-contact electrode 9 contacting with the GaN buffer layer 2 and covering the recessed trench of the Schottky source electrode structure, a side of the source Schottky-contact electrode 9 contacts the AlGaN layer 3. The Schottky drain electrode structure has a grooved Schottky structure, which comprises a recessed trench formed by etching the AlGaN layer 3 and a part of the GaN buffer layer 2 and a drain Schottky-contact electrode 10 contacting with the GaN buffer layer 2 and covering the recessed trench of the Schottky drain electrode structure, a side of the drain Schottky-contact electrode contacts the AlGaN layer 3.

A first insulated gate structure is located on the AlGaN layer 3 and adjacent to the source Schottky-contact electrode 9. A second insulated gate structure is located on the AlGaN layer 3 and adjacent to the drain Schottky-contact electrode 10. The first insulated gate structure and the second insulated gate structure are symmetrical with respect to the median vertical line of the GaN-based bidirectional switch device. The first insulated gate structure comprises a recessed trench formed by etching a part of the AlGaN layer 3, an insulated gate dielectric 6 covering the recessed trench of the first insulated gate structure, and a first metal gate electrode 7 covering an insulating medium which forms the insulated gate dielectric of the first insulated gate structure. The second insulated gate structure comprises a recessed trench formed by etching a part of the AlGaN layer 3, an insulated gate dielectric 6 covering the recessed trench of the second insulated gate structure, and a second metal gate electrode 8 covering an insulating medium which the insulated gate dielectric of the second insulated gate structure. The first metal gate electrode 7 and the source Schottky-contact electrode 9 are separated only by the insulated gate dielectric of the first insulated gate structure, the second metal gate electrode 8 and the drain Schottky-contact electrode 10 are separated only by the insulated gate dielectric of the second insulated gate structure.

Particularly, a respective depth of each of the source Schottky-contact electrode 9 and the drain Schottky-contact electrode 10 are embedded in the GaN buffer layer 2 is 0.5 um.

Particularly, the insulated gate dielectric 6 is made of material selected from a group consisting of $SiO_2$, $SiN_4$, AlN, $Al_2O_3$, MgO, and $Sc_2O_3$.

It is important to note that the ability to block off the device can be increased by increasing the depth that the insulated gate electrode is embedded in the AlGaN layer's surface.

The benefit of the present invention is that, compared with the traditional structure, the device of the present invention has the advantages of high utilization ratio of chip area, low on-state resistance, high reverse blocking ability, and low power consumption, especially in matrix converters. Due to the only presence of Schottky in this invention, no heavy elements such as gold is required, so the present invention is compatible with traditional CMOS technology.

DETAILED DESCRIPTION OF THE INVENTION

The technical scheme of the invention is described in detail below.

Figure 1:
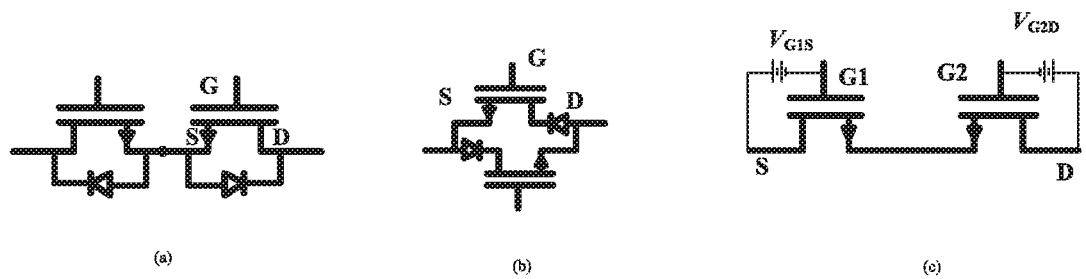
FIG. 1 shows the structure of the traditional bidirectional switch device, wherein (a) is the series type, (b) is the parallel type, and (c) is the device type.
Figure 2:
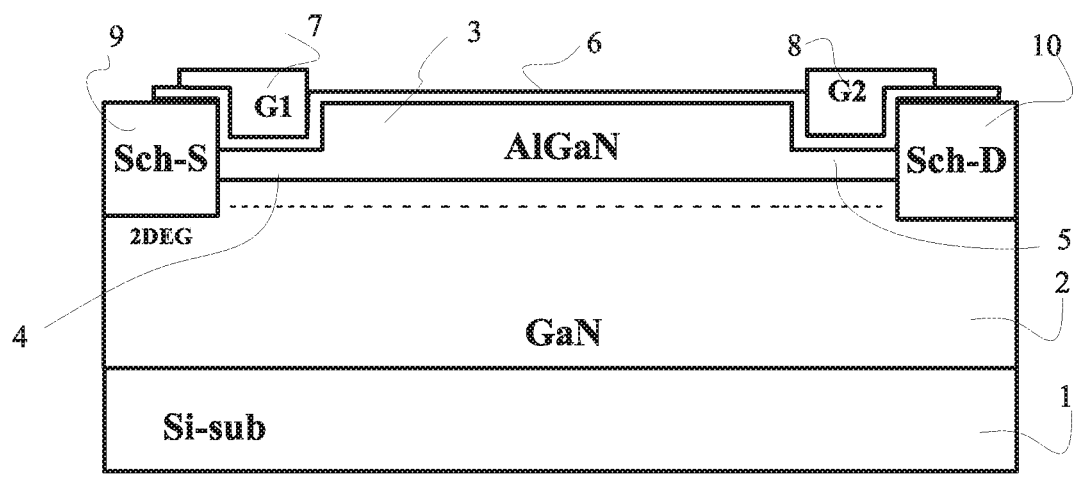
FIG. 2 shows the structure of the present invention.

As shown in FIG. 2, the GaN-based bidirectional switch device comprises a substrate 1, a GaN buffer layer 2, an AlGaN layer 3. The GaN buffer layer 2 and the AlGaN layer 3 form a heterojunction. A Schottky source electrode structure is located at one end of the GaN-based bidirectional switch device, and a Schottky drain electrode structure is located at an other end of the GaN-based bidirectional switch device. The Schottky source electrode structure and the Schottky drain electrode structure are symmetrical with respect to a median vertical line of the GaN-based bidirectional switch device. The Schottky source electrode structure has a grooved Schottky structure, which comprises a recessed trench formed by etching the AlGaN layer 3 and a part of the GaN buffer layer 2 and a source Schottky-contact electrode 9 contacting with the GaN buffer layer 2 and covering the recessed trench of the Schottky source electrode structure, a side of the source Schottky-contact electrode 9 contacts the AlGaN layer 3. The Schottky drain electrode structure has a grooved Schottky structure, which comprises a recessed trench formed by etching—the AlGaN layer 3 and a part of the GaN buffer layer 2 and a drain Schottky-contact electrode 10 contacting with the GaN buffer layer 2 and covering the recessed trench of the Schottky drain electrode structure, a side of the drain Schottky-contact electrode contacts the AlGaN layer 3.

A first insulated gate structure is located on the AlGaN layer 3 and adjacent to the source Schottky-contact electrode 9. A second insulated gate structure is located on the AlGaN layer 3 and adjacent to the drain Schottky-contact electrode 10. The first insulated gate structure and the second insulated gate structure are symmetrical with respect to the median vertical line of the GaN-based bidirectional switch device. The first insulated gate structure comprises a recessed trench formed by etching a part of the AlGaN layer 3, an insulated gate dielectric 6 covering the recessed trench of the first insulated gate structure, and a first metal gate electrode 7 covering an insulating medium which forms the insulated gate dielectric of the first insulated gate structure. The second insulated gate structure comprises a recessed trench formed by etching a part of the AlGaN layer 3, an insulated gate dielectric 6 covering the recessed trench of the second insulated gate structure, and a second metal gate electrode 8 covering an insulating medium which the insulated gate dielectric of the second insulated gate structure. The first metal gate electrode 7 and the source Schottky-contact electrode 9 are separated only by the insulated gate dielectric of the first insulated gate structure, the second metal gate electrode 8 and the drain Schottky-contact electrode 10 are separated only by the insulated gate dielectric of the second insulated gate structure.

The bidirectional switches based on the reverse conducting devices have large on-state voltage drop and on-state loss. In addition, the utilization rate of the chip's area of the bidirectional switch based on the reverse blocking device is low. The invention proposes the GaN-Based bidirectional switch device (as FIG. 2). The source and drain of this device are Schottky contacted. At the same time, the AlGaN layer near the source and drain structure has a gate structure. This device has no Ohmic-contact and no requirement for using heavy metal and can be compatible with CMOS process. Each insulated gate structure near Schottky-contact controls the band structure of the Schottky-contact to change the working state of the device, realizing the bidirectional switch's ability of bidirectional conducting and blocking. At the same time, there is only one conductive channel in the device, and the chip area has a high utilization rate. In addition, the on-state resistance, leakage current and on-state voltage drop can be controlled by the gate, which controls the on-state resistance and the on-state voltage drop by controlling the thickness of AlGaN barrier layer under the gate structure TG, the power function of gate metal W, and the length of the groove MIS structure. The blocking ability of the GaN-Based bidirectional switch device is decided by both gate structure and Schottky structure. The device has a better reverse blocking ability when the thickness of the AlGaN barrier layer under the gate structure is relatively thin and the source Schottky-contacting barrier is relatively large. However, this can cause the increase of on-state resistance and on-state voltage drop.

It is important to note that the design process of the invention embodies the following details.

1. The AlGaN barrier layer of source and drain is etched as far as possible.

2. A passivation layer is deposited on the surface of AlGaN layer to further reduce leakage and improve performance.

3. The Schottky-contact and the structure of insulated gate are separated by insulating medium, and the quality of media directly affects the performance of the device.

The basic working principle of this device is as below.

Figure 3:
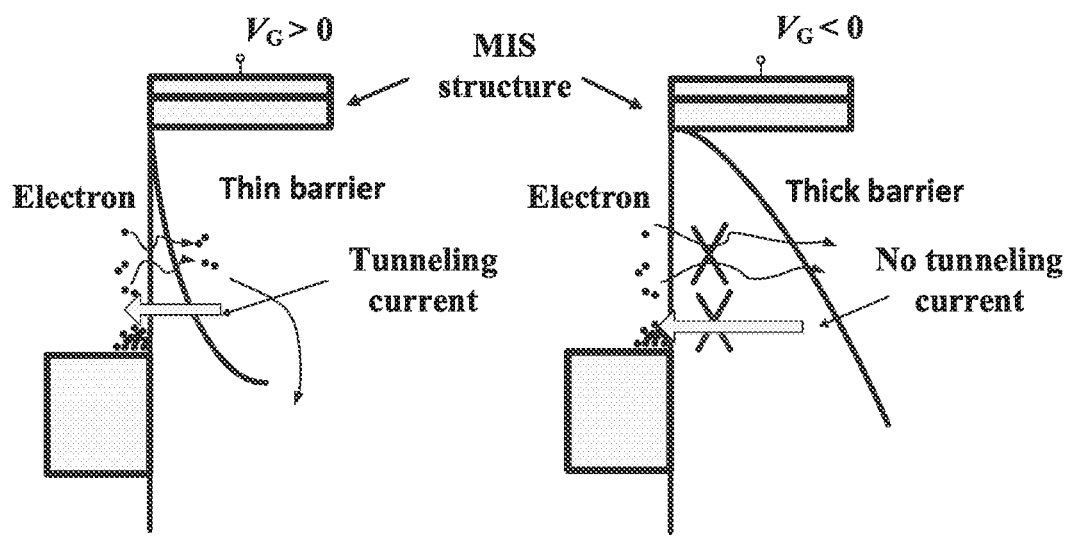
FIG. 3 shows working principle of the present invention.
Figure 4:
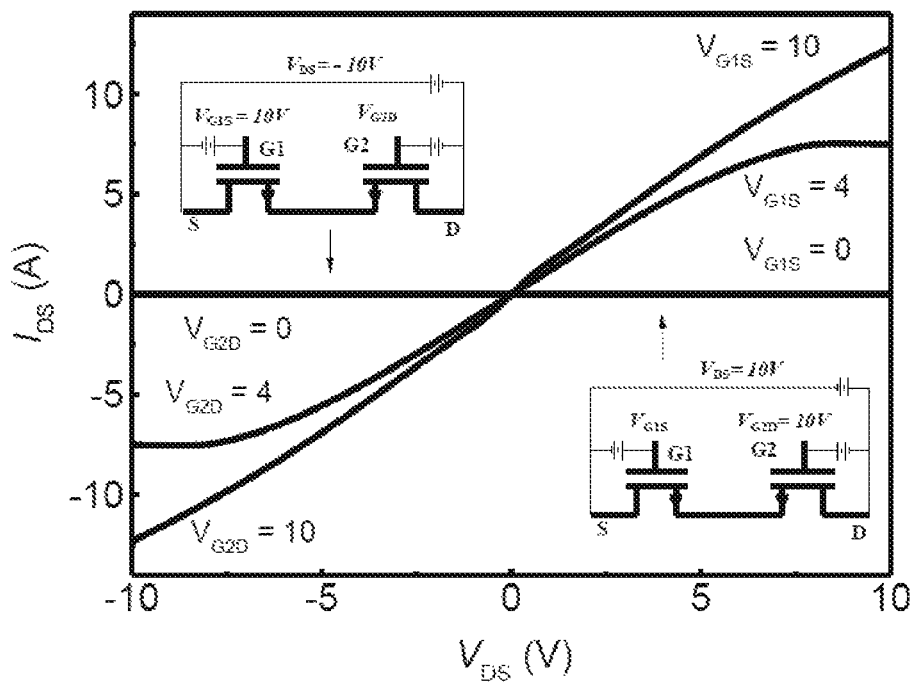
FIG. 4 shows the bidirectional conducting characteristics of GaN-based bidirectional switch of the present invention.
Figure 5:
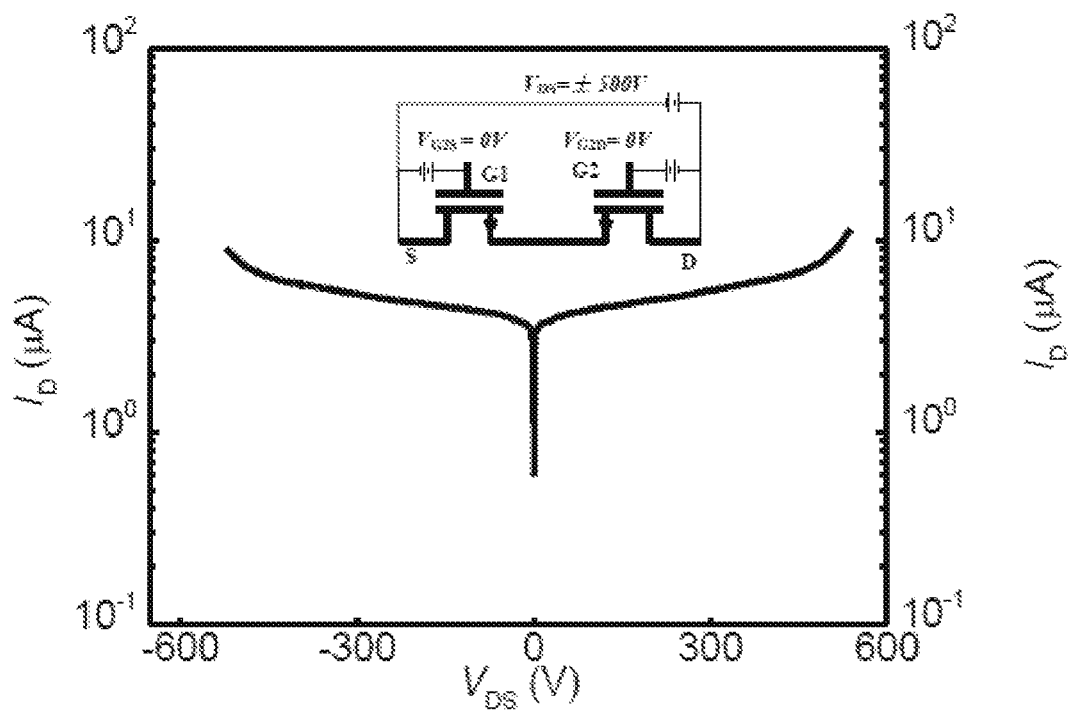
FIG. 5 shows the bidirectional blocking characteristics of GaN-based bidirectional switch of the present invention.

Firstly, each insulated gate structure near Schottky-contact controls the band structure of the Schottky-contact to change the working state of the device, realizing the bidirectional switch's ability of bidirectional conducting and blocking. When the gate is applied with a positive voltage, the thickness of the barrier near Schottky is thinned (FIG. 3), the probability of the electron tunneling increases, and thus the device can have the current characteristics similar to ohm's contact. When the gate is applied with a negative voltage, the thickness of the barrier near Schottky becomes thicker, the probability of electron tunneling is reduced, and the electron is almost impossible to pass the barrier. Therefore, the device can realize the blocking ability. When only one gate is applied with a positive voltage, the bidirectional switch can only be used in one direction to conduct the current, and in the other direction it shows the ability of blocking. The invention uses the Schottky junction and insulated gate structure to suppress the reverse leakage of the device. The invention increases the depletion capacity of the carrier under the gate by reducing the thickness of the barrier layer under the insulated gate. The simulation circuit diagram as shown in FIG. 5. The blocking mechanism of the bidirectional switch can be explained as follows. When the voltage is low, the Schottky-contacting barrier of source and drain blocks the current. When the voltage increases, the carriers at the bottom of the gate near Schottky begins to run out. When the carriers under the gate get completely exhausted, the carriers cannot pass through the gate channel, then the insulated gate blocks current. Reducing the thickness of the barrier layer can increase the blocking ability of the device. FIG. 4 shows the bidirectional conduction characteristics of the present GaN-based bidirectional switch. FIG. 5 shows the bidirectional blocking characteristics of the GaN-based bidirectional switch.

The device of this invention is compatible with the traditional CMOS process and can be made by using the traditional CMOS process line. What needs to be specified specifically is the following.

1. The groove of drain electrode and source electrode must be extended to GaN.

2. The material of the insulated gate dielectric 6 is $SiO_2$, $SiN_4$, AlN, $Al_2O_3$, MgO, or $Sc_2O_3$.

3. The first partially recessed shallow trench 4 must be near the source Schottky-contact, and the second partially recessed shallow trench 5 must be near the drain Schottky-contact.

4. The blocking ability of the device can be increased by increasing the depth of the first partially recessed shallow trench 4 and the second partially recessed shallow trench 5.

In the present invention, the following two schemes can be used to prepare the insulating medium materials.

(a) The dielectric material (such as $Al_2O_3$, $HfO_2$ and $TiO_2$) is prepared by atomic layer deposition (ALD). The film grown by ALD is self-limiting, and the thickness and chemical composition of the film can be accurately controlled. The deposited film has good uniformity and conformal properties. The composite laminates, such as $HfO_2$/$Al_2O_3$, etc, should be considered.

(b) A variety of single-layer, multi-layer, and various laminated structures (such as $Ga_2O_3$, $Al_2O_3$, AlGaO or AlGaO/$Al_2O_3$) are prepared though MOCVD equipment to prepare high-performance insulating grid media. MOCVD method has the advantages of dense film-forming state of dielectric material, accurate thickness control, easily forming hybrid film, and good repeatability of multilayer film, especially the large controlled space in interface state controlling.

The manufacturing process of the invention is shown in FIG. 6-FIG. 11 and mainly comprises the following steps.

Figure 6:
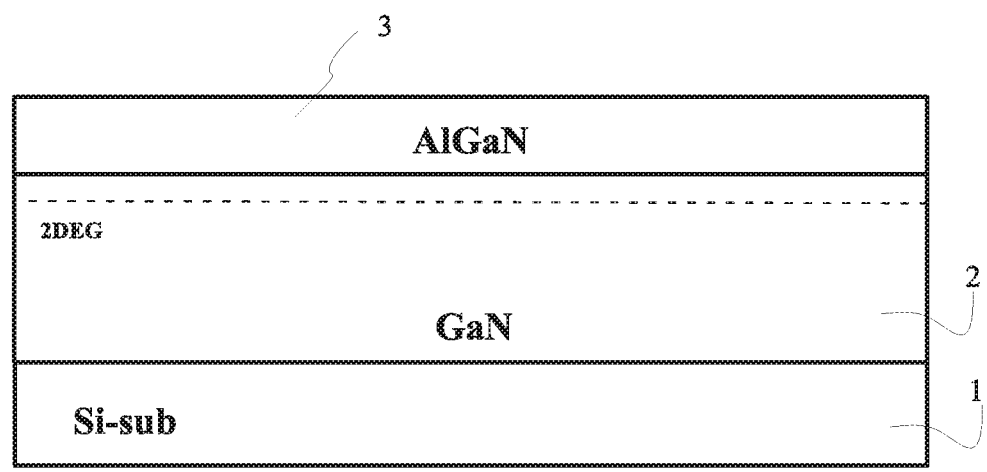
FIG. 6 shows the substrate of the present invention.
Figure 7:
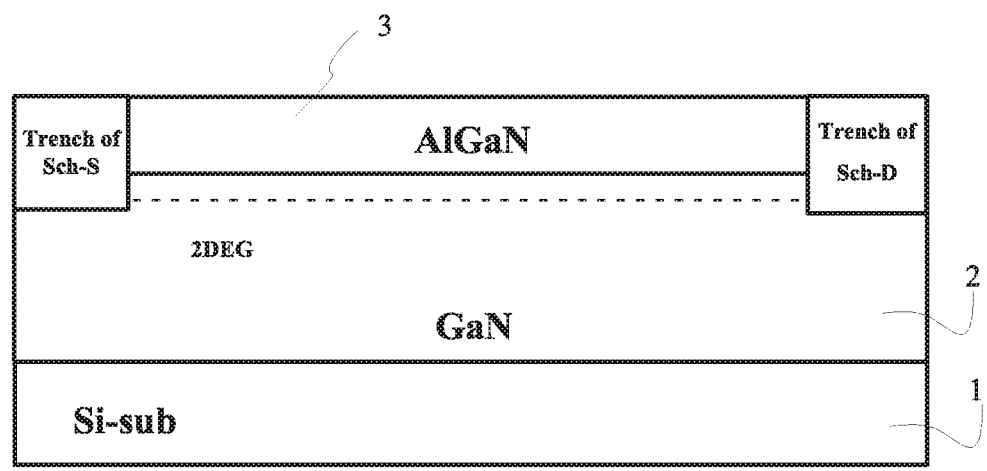
FIG. 7 shows the structure diagram of the barrier layer to the GaN buffer layer in the process flow of the device manufacturing process.
Figure 8:
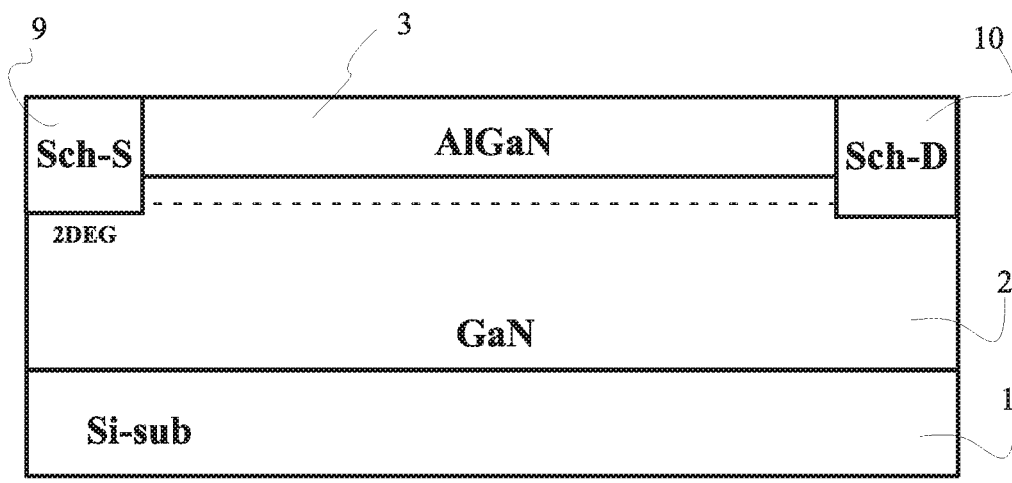
FIG. 8 is a schematic diagram of the structure of the source extreme Schottky-contact and the leaky Schottky-contact in the manufacturing process of the invention.
Figure 9:
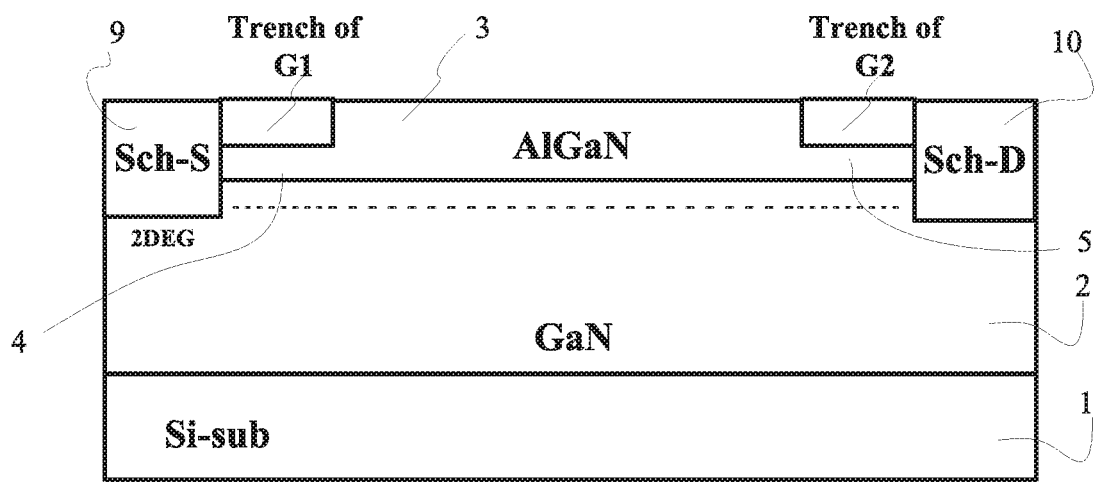
FIG. 9 shows the schematic diagram of the structure of the first and second partially recessed shallow trench in the manufacturing process of the device.
Figure 10:
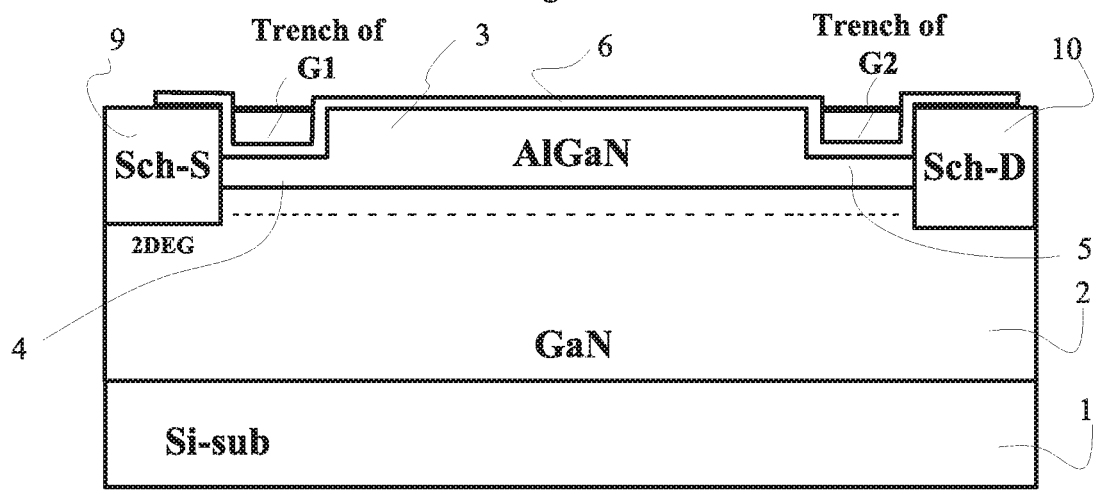
FIG. 10 is a schematic diagram of the post-deposition insulation layer in the manufacturing process of the device.
Figure 11:
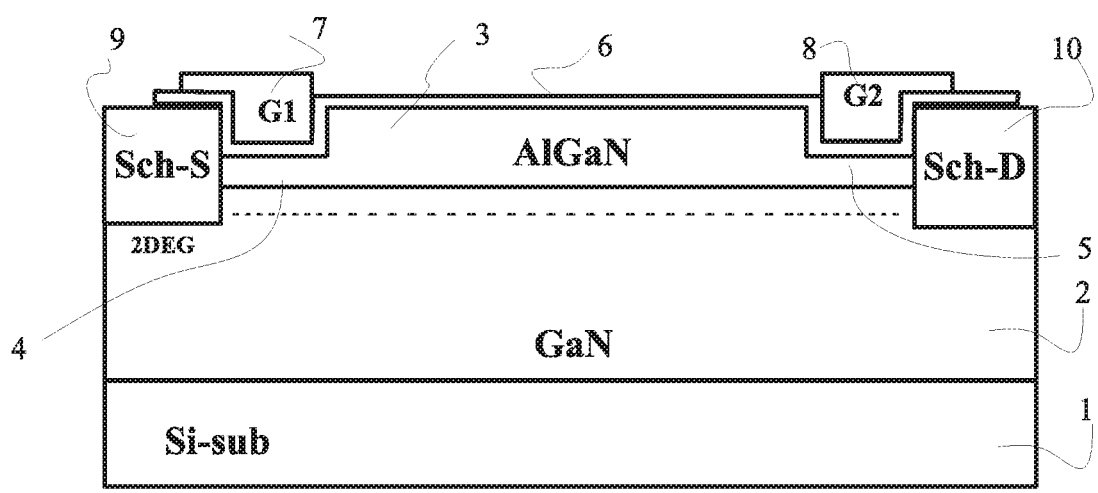
FIG. 11 shows the schematic diagram of the metal back in the first partially recessed shallow trench and the second partially recessed shallow trench in the manufacturing process of the invention.

FIG. 6 shows the preparation of heterojunction with substrate and barrier layer. FIG. 7 shows etching barrier layer to GaN buffer layer in source and drain contact. FIG. 8 shows passivating opening and producing source and drain Schottky-contact metal. FIGS. 9 and 10 show providing openings in the first recessed trench gate and the second recessed trench gate and depositing insulating dielectric. FIG. 11 shows deposition of gate metal.

Device simulation software Sentaurus is used to primarily simulate and analyze the structure of the invention. In this simulation, gate length is 1 μm, the medium thickness between the gate and source is 10 nm, the distance between the two gates is 10 μm, the width of the gate is 10000 μm, the thickness of the GaN buffer layer is 3 μm, the thickness of $Al_{0.26}Ga_{0.74}N$ barrier layer is 25 nm, and the gate metal working function is 4.5 eV. The Schottky barrier of source and drain are 1.0 eV.

It can be seen from the curve of the bidirectional conducting characteristics (FIG. 4), when the gate voltage is 10 V and the current is 5 A, the on-state resistance of the device is 0.997 mΩ·cm². FIG. 5 is the bidirectional blocking characteristic curve of the bidirectional switch device. When the gate voltage is 0V and the drain voltage is ±500 V, the leakage current is 10 μA. This shows that the device has bidirectional blocking capability. Through the above simulation, the excellent performance of the invention is verified.

What is claimed is:

1. A GaN-based bidirectional switch device, comprising from bottom to top:
 a substrate;
 a GaN buffer layer; and
 an AlGaN layer;

wherein the GaN buffer layer and the AlGaN layer form a heterojunction;

a Schottky source electrode structure is located at one end of the GaN-based bidirectional switch device, and a Schottky drain electrode structure is located at an other end of the GaN-based bidirectional switch device;

the Schottky source electrode structure and the Schottky drain electrode structure are symmetrical with respect to a median vertical line of the GaN-based bidirectional switch device;

the Schottky source electrode structure has a grooved Schottky structure comprising a recessed trench formed by etching the AlGaN layer and a part of the GaN buffer layer and a source-Schottky-contact electrode contacting with the GaN buffer layer and covering the recessed trench of the Schottky source electrode structure, a side of the source Schottky-contact electrode contacts the AlGaN layer, the Schottky drain electrode structure has a grooved Schottky structure comprising a recessed trench formed by etching the AlGaN layer and a part of the GaN buffer layer and a drain Schottky-contact electrode contacting with the GaN buffer layer and covering the recessed trench of the Schottky drain electrode structure, a side of the drain Schottky-contact electrode contacts the AlGaN layer;

a first insulated gate structure is located on the AlGaN layer and adjacent to the source Schottky-contact electrode;

a second insulated gate structure is located on the AlGaN layer and adjacent to the drain Schottky-contact electrode;

the first insulated gate structure and the second insulated gate structure are symmetrical with respect to the median vertical line of the GaN-based bidirectional switch device;

the first insulated gate structure comprises a recessed trench formed by etching a part of the AlGaN layer, an insulated gate dielectric covering the recessed trench of the first insulated gate structure, and a first metal gate electrode covering an insulating medium which forms the insulated gate dielectric of the first insulated gate structure;

the second insulated gate structure comprises a recessed trench formed by etching a part of the AlGaN layer, an insulated gate dielectric covering the recessed trench of the second insulated gate structure, and a second metal gate electrode covering an insulating medium which forms the insulated gate dielectric of the second insulated gate structure;

the first metal gate electrode and the source Schottky-contact electrode are separated only by the insulated gate dielectric of the first insulated gate structure;

the second metal gate electrode and the drain Schottky-contact electrode are separated only by the insulated gate dielectric of the second insulated gate structure;

the insulated gate dielectric of the first insulated gate structure directly contacts a top portion and a side portion of the source Schottky-contact electrode and the first metal gate electrode directly contacts the insulated gate dielectric of the first insulated gate structure on both the portions of the insulated gate dielectric of the first insulated gate structure that contact the top portion and the side portion of the source Schottky-contact electrode; and the insulated gate dielectric of the second insulated gate structure directly contacts a top portion and a side portion of the drain Schottky-contact electrode and the second metal gate electrode directly contacts the insulated gate dielectric of the second insulated gate structure on both the portions of the insulated gate dielectric of the second insulated gate structure that contact the top portion and the side portion of the drain Schottky-contact electrode.

2. The GaN-based bidirectional switch device according to claim 1, wherein a respective depth of each of the source Schottky-contact electrode and the drain Schottky-contact electrode embedded in the GaN buffer layer is 0.5 um.

3. The GaN-based bidirectional switch device according to claim 1, wherein the insulated gate dielectrics of the first insulated gate structure and the second insulated gate structure are made; of material selected from a group consisting of $SiO_2$, $SiN_4$, AlN, $Al_2O_3$, MgO, and $Sc_2O_3$.

* * * * *